United States Patent
Sausen

(10) Patent No.: US 6,626,682 B2
(45) Date of Patent: Sep. 30, 2003

(54) INTEGRATED CIRCUIT DEVICE SOCKET

(76) Inventor: Earl W. Sausen, 1370 Redwood La., Gilroy, CA (US) 95020

( * ) Notice: Subject to any disclaimer, the term of this patent is extended or adjusted under 35 U.S.C. 154(b) by 0 days.

(21) Appl. No.: 10/175,670

(22) Filed: Jun. 20, 2002

(65) Prior Publication Data

US 2003/0049953 A1 Mar. 13, 2003

Related U.S. Application Data

(60) Provisional application No. 60/322,032, filed on Sep. 13, 2001.

(51) Int. Cl.[7] .............................................. H01R 12/00
(52) U.S. Cl. ............................ 439/70; 439/71; 439/73; 439/330; 324/754
(58) Field of Search .......................... 439/73, 330, 331, 439/527, 70, 71; 324/754

(56) References Cited

U.S. PATENT DOCUMENTS

| | | | | |
|---|---|---|---|---|
| 5,127,837 A | * | 7/1992 | Shah et al. ................. | 439/73 |
| 5,205,742 A | * | 4/1993 | Goff et al. ................. | 439/73 |
| 5,493,237 A | * | 2/1996 | Vol et al. ................... | 439/73 |
| 5,574,383 A | * | 11/1996 | Saito et al. ................. | 439/71 |

* cited by examiner

*Primary Examiner*—P. Austin Bradley
*Assistant Examiner*—Briggitte R. Hammond
(74) *Attorney, Agent, or Firm*—Robert Charles Hill

(57) ABSTRACT

An integrated circuit device socket is spring-loaded to accept and capture a semiconductor device. As the frame springs relax, a device nest and capture arms lower the device down onto a grid of pogo-pins that probe the contacts underneath. Such pogo-pins pass through a dielectric grate, and are self-cleaning. The capture arms lock as they slide into constraint channels. Such prevents the device from escaping when a large aggregate force is applied from beneath by the pogo-pins. Each pogo-pin can generate 20-grams of contact force, and combine to as many as six pounds of force. To release the device, cams are used to force the frame springs open. The constraint channels clear the capture arms. The device releases when the capture arms move apart fully open.

12 Claims, 2 Drawing Sheets

INTEGRATED CIRCUIT DEVICE SOCKET

RELATED APPLICATION

This Application claims benefit of an earlier-filed U.S. Provisional Patent Application by the present inventor, Earl Sausen, Ser. No. 60/322,032, filed Sep. 13, 2001, and titled A Passive Restraint High Insertion Configurable Socket.

BACKGROUND OF THE INVENTION

1. Field of the Invention

The present invention relates to electronic components, and more particularly to integrated circuit device sockets useful for programming and testing of semiconductor devices during manufacturing.

2. Description of Related Art

The new packaging technologies being used for semiconductor integrated circuits have more wiring leads and are much smaller than traditional dual inline plastic (DIP) packages. Some of the new device packages have 100–200 contacts arranged on the edges or bottoms of ceramic carriers. One type, a ball grid array (BGA) device package typically uses a 7×7 or 10×10 grid of solder balls on a bottom surface of the device package with contact-to-contact lead pitches of 0.5, 0.65, 0.75, 0.80, 1.0, and 1.2 millimeters. A common BGA outside dimension is 12-millimeters square.

Testing and/or programming such devices in a manufacturing environment can be quite challenging. Sockets typically only last 5,000 cycles. Current socket technology for BGA devices limits high quality tests. So many good devices and sockets falsely appear to be bad. Even ATE sockets that initially do a good job of making electrical contact, wear out quickly, or get dirty and clogged.

SUMMARY OF THE INVENTION

Briefly, an integrated circuit device socket embodiment of the present invention is spring-loaded to reach out and capture a semiconductor device. For example, one to be programmed or tested in automatic test equipment. As the frame springs relax, the device collared by a device nest and capture arms lower down onto a grid of pogo-pins that probe the contacts on the device. Such pogo-pins pass through a dielectric grate. Each cycle, the capture arms lock as they slide into constraint channels. Such prevents the device from escaping when a large aggregate force is applied from beneath by the pogo-pins. Each pogo-pin typically generates 20-grams of contact force. To release the device, cams are used to force the frame springs open. The constraint channels clear the capture arms. The device releases when the capture arms fling apart fully open.

An advantage of the present invention is that a integrated circuit device socket is provided that can operate reliably over 500,000 cycles.

A further advantage of the present invention is that integrated circuit device socket is provided that can be readily adapted to alternative contact pitches.

A still further advantage of the present invention is that integrated circuit device socket is provided that can be readily adapted to alternative device overall dimension sizes.

The above and still further objects, features, and advantages of the present invention will become apparent upon consideration of the following detailed description of specific embodiments thereof, especially when taken in conjunction with the accompanying drawings.

DETAILED DESCRIPTION OF THE INVENTION

Figure 1A:
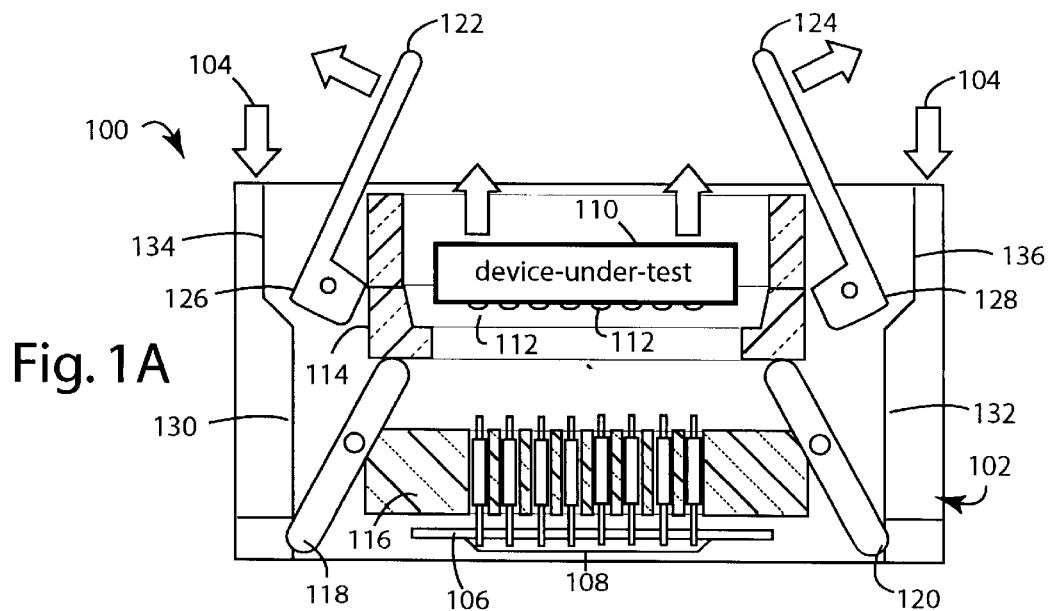
FIG. 1A is a cross-sectional view of an integrated circuit device socket embodiment of the present invention shown in its open and unlocked position. Such position is forced by a user pushing down as indicated by arrows.
Figure 1B:
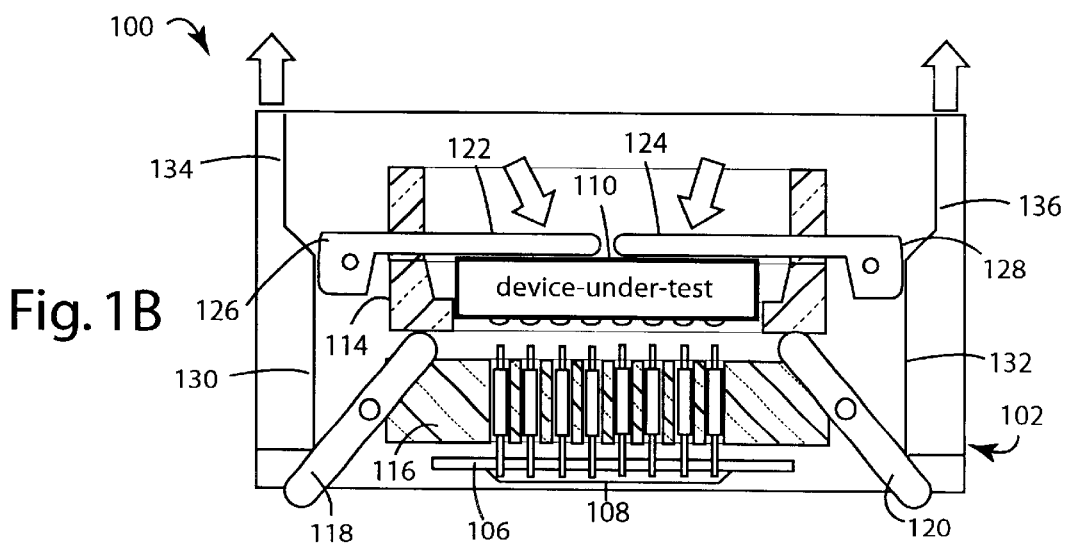
FIG. 1B is a cross-sectional view of the integrated circuit device socket of FIG. 1A shown in its closed and unlocked position. Such position is interim between those of FIGS. 1A and 1C.
Figure 1C:
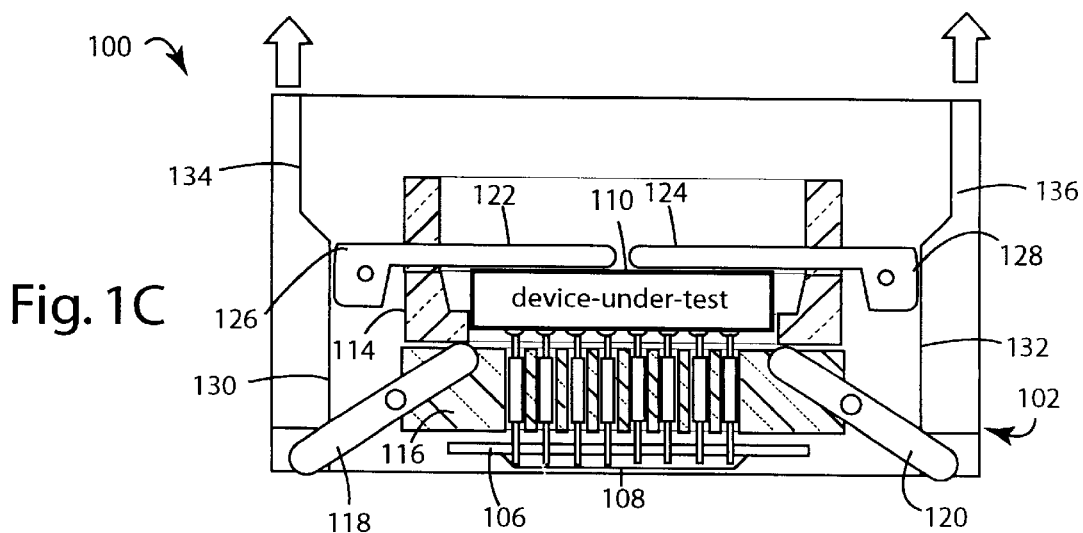
FIG. 1C is a cross-sectional view of an integrated circuit device socket of FIGS. 1A and 1B shown in its closed and locked position. Such a position is the relaxed state which is reached once the user has released pressure on the pusher body of the socket.

FIGS. 1A–1C illustrate an integrated circuit device socket embodiment of the present invention, and is referred to herein by the general reference numeral 100. The socket 100 has many uses, including uses in automatic test equipment (ATE) for manufacturing testing and device programming. In general, the socket 100 opens to release and capture a device-under-test (DUT), as in FIG. 1A. In the position of FIG. 1B, the socket is closed and just beginning to lock onto the DUT. In FIG. 1C, the bottom of the DUT is probed and electrical contact is established.

Referring now to FIG. 1A, the socket 100 comprises a pusher body 102 that is held up by spring tension. When a user pushes down, e.g., force arrows 104, the pusher body reaches its bottom limit of travel relative to the other components inside its frame. A pin housing 106 stays in one place during the whole cycle represented by FIGS. 1A–1C. A set of pogo-pins 108 are supported by the pin housing 106. These are set in various grid patterns and contact-to-contact pitches, according to the requirements of a particular device-under-test (DUT) 110. For example, the DUT can be a ball grid array (BGA) type semiconductor integrated circuit (IC) ceramic package with solder bumps 112 underneath. The outside package dimensions for a common BGA device DUT 110 is 12-millimeters square. Such use a two-dimensional pin-out grid arrays of 3-mm by 3-mm, to as large as 15-mm by 15-mm, with contact-to-contact lead pitches of 0.5, 0.65, 0.75, 0.80, 1.0, and 1.2 millimeters. Other sizes and package types are also readily accommodated, even once in the field.

In the open position of FIG. 1A, the DUT 110 is funneled and collared-in by a device nest 114 made of dielectric material, e.g., resin, plastic, ceramic, etc. Such device nest 114 ensures proper device alignment relative to the top ends of the pogo-pins 108. A device seat 116 has a matrix of pin-holes for the pogo-pins 108. A pair of actuator cams 118 and 120 forced by the downward travel of pusher body 102 will lift the device nest 114 from the device seat 116 such that the pogo-pins 108 disconnect. The pusher body 102 and device seat 116 do not move relative to one another.

The opening and closing action promotes self-cleaning of the electrical contacts and helps slough off debris.

The actuator cams 118 and 120 work against very strong spring pressure that tries to keep the device nest 114 and device seat 116 firmly seated on the pin housing 106. Such actuator cams 118 and 120 preferably have a 6:1 ratio of leverage. A pair of device catch arms 122 and 124 are shown fully open. A pair of cams 126 and 128 have cleared locking shoulders 130 and 132 and are free to rotate into a clearance trough 134 and 136.

In some applications, twenty grams of pressure is needed by each pogo-pin 108 against its respective contact on the bottom of DUT 110. So, for a 144-pin device, the aggregate pressure needed is on the order of four to five pounds of force. In other cases where there are as many as 500 pins, only six grams of force is used, but that can still combine to as many as seven pounds of pressure. The prior art has not been able to deal with such high aggregate pressures. The unique construction of embodiments of the present invention allow the use of pogo pins, even though they combine to create very high socket pressures.

FIG. 1B shows the DUT 110 bottomed inside the device nest 114. The device catch arms 122 and 124 are shown closed over the DUT 110, but not quite locked. Such lock when the cams 126 and 128 are constrained within locking shoulders 130 and 132. The actuator cams 118 and 120 are shown halfway rotated to their at-rest positions. The pogo-pins 108 are rising inside the device seat 116, but are not quite yet protruding.

FIG. 1C shows the DUT 110 locked down inside the device nest 114, it cannot be forced up and out. The device catch arms 122 and 124 are locked because the cams 126 and 128 are fully constrained within locking shoulders 130 and 132. The actuator cams 118 and 120 are shown fully rotated to their at-rest positions. The pogo-pins 108 are fully lifted inside the device seat 116 and protrude to contact the bottom of DUT 110.

Figure 2:
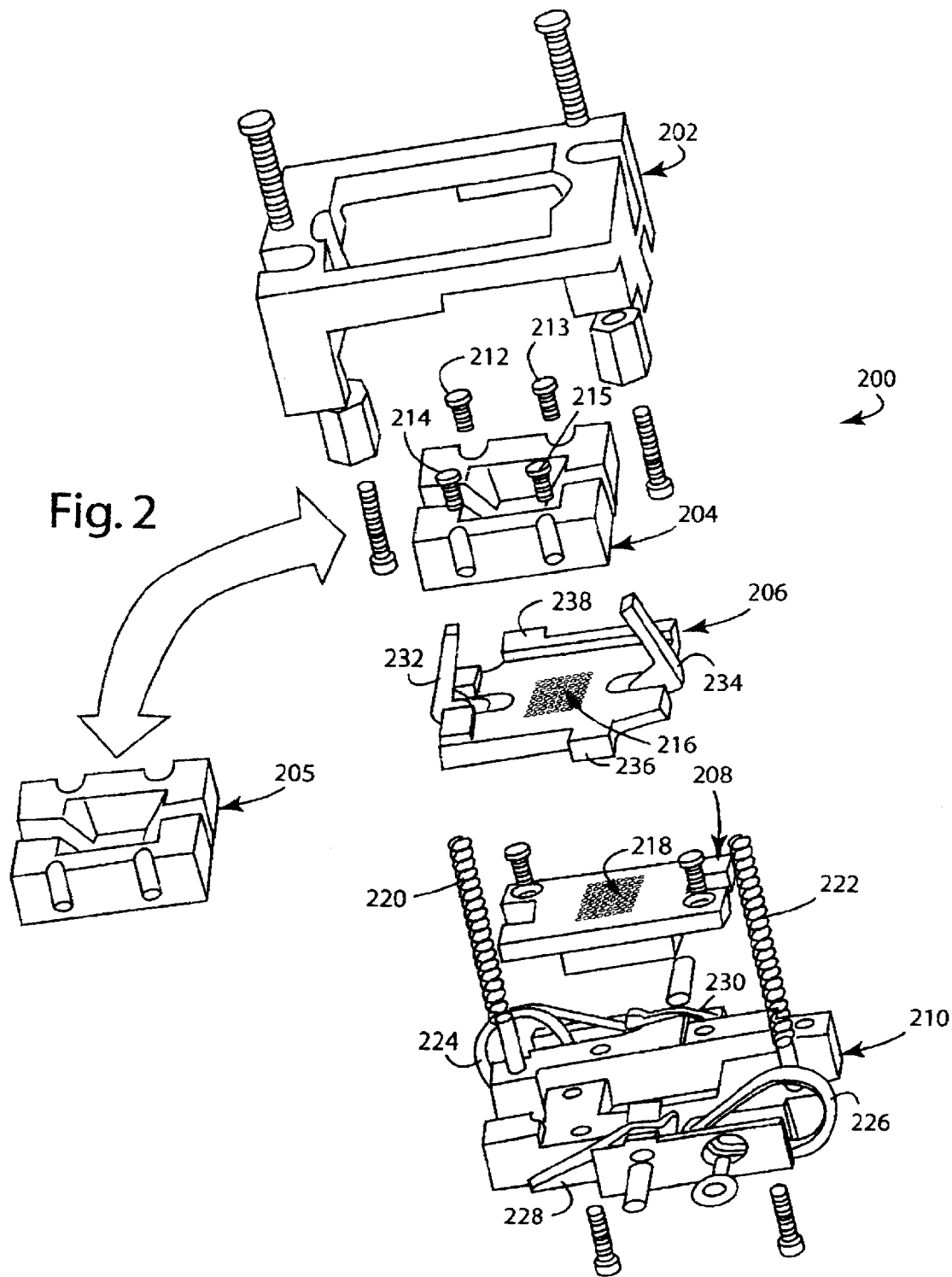
FIG. 2 is a perspective, exploded assembly view of an integrated circuit device socket embodiment of the present invention similar to that of FIGS. 1A–1C.

FIG. 2 represents one way the socket 100 of FIGS. 1A–1C can be implemented. A device socket 200 comprises a pusher body 202, a device nest 204, a device seat 206, and a pin housing 208, that are all assembled to a base 210. A number of machine-screw fasteners are used to hold the assembly together. Four such screws 212–215 allow for easy field replacement of the device nest 204. Another device nest 205 is also shown in FIG. 2 which can replace device nest 204. Different size DUT's can thus be accommodated. A matrix of pin holes 216 allow a corresponding set of pogo-pins to pass through. The pogo-pins are fixed to a respective pinhole matrix 218 in the pin housing 208. A pair of compression springs 220 and 222 force the pusher body 202 up and into its relaxed position when the user lets go. A pair of actuation springs 224 and 226 provide the main force that pushes the pogo-pins up under the DUT when a pair of actuator cams 228 and 230 allow it Such actuator cams 228 and 230 are the equivalent of actuator cams 118 and 120 in FIGS. 1A–1C. A pair of device catch arms 232 and 234 operate exactly as described for device catch arms 122 and 124 in FIGS. 1A–1C.

A pair of ears 236 and 238 on the edges of device seat 206 are the bearing points against which the short arms of actuator cams 228 and 230 work against. Springs 224 and 226 keep the device seat 206 tight against pin housing 208, so the pogo-pins (shown only in FIGS. 1A–1C) fully penetrate the matrix of pin holes 216 to contact the underside of the DUT. As the pusher body 202 is pressed down, it forces the long ends of actuator cams 228 and 230 down. The short arms under ears 236 and 238 press up with magnified force, e.g., 6:1. This separates the device seat 206 from pin housing 208.

Although particular embodiments of the present invention have been described and illustrated, such is not intended to limit the invention. Modifications and changes will no doubt become apparent to those skilled in the art, and it is intended that the invention only be limited by the scope of the appended claims.

What is claimed is:

1. An integrated circuit device socket, comprising:
a pair of clamping arms for capturing and locking a device-under test (DUT) in place;
a bed of contact pins for providing simultaneous electrical contact to a bottom surface of said DUT;
a mechanical assembly for sequencing the pair of clamping arms to first capture said DUT and lock it in place, and then pressing the bed of contact pins together with said DUT.
a plurality of device nests that can each one be disposed within the pair of clamping arms and for providing an alignment of said DUT with the bed of contact pins;
wherein different ones of the plurality of device nests accommodate corresponding different sizes of said DUT.

2. The socket of claim 1, further comprising:
a device bed with a matrix of pin holes that allow the bed of contact pins to penetrate and contact said DUT from beneath.

3. The socket of claim 1, further comprising:
A set of springs for providing a contact force between the bed of contact pins and said DUT.

4. An integrated circuit device socket, comprising:
a pair of clamping arms for capturing and locking a device-under-test (DUT) in place;
a plurality of pogo-pins fixed to a pin housing and for providing simultaneous electrical contact to a bottom surface of said DUT; and
a mechanical assembly for sequencing the pair of clamping arms to first capture said DUT and lock it in place, and then pressing the pogo-pins up under said DUT;
a device nest disposed within the pair of clamping arms and for providing an alignment of said DUT with the plurality of pogo-pins;
a device bed with a matrix of pin holes that allow the pogo-pins to penetrate and contact said DUT from beneath;
a pusher body that frames in the pair of clamping arms and bed of contact pins, and for providing a user a way to actuate the pair of clamping arms and bed of contact pins about said DUT;
a constraint channel associated with clamping arms that moves at a user's urging to lock and unlock the clamping arms about said DUT; and
a set of springs for providing a contact force between the bed of contact pins and said DUT.

5. The socket of claim 4, further comprising:
a plurality of device nests that can each one be disposed within the pair of clamping arms and for providing an alignment of said DUT with the pogo-pins;
wherein different ones of the plurality of device nests accommodate corresponding different sizes of said DUT.

6. An integrated circuit device socket, comprising:
a pair of clamping arms for capturing and locking a device-under-test (DUT) in place;
a bed of contact pins for providing simultaneous electrical contact to a bottom surface of said DUT;
a mechanical assembly for sequencing the pair of clamping arms to first capture said DUT and lock it in place, and then pressing the bed of contact pins together with said DUT; and a pusher body that frames in the pair of clamping arms and bed of contact pins, and for providing a user a way to actuate the pair of clamping arms and bed of contact pins about said DUT.

7. The socket of claim 6, further comprising:

a device nest disposed within the pair of clamping arms and for providing an alignment of said DUT with the bed of contact pins.

8. The socket of claim 6, further comprising:

a set of springs for providing a contact force between the bed of contact pins and said DUT.

9. The socket of claim 6, further comprising:

a device bed with a matrix of pin holes that allow the bed of contact pins to penetrate and contact said DUT form beneath.

10. An integrated circuit device socket, comprising:

a pair of clamping arms for capturing and locking a device-under-test (DUT) in place;

a bed of contact pins for providing simultaneous electrical contact to a bottom surface of said DUT;

a mechanical assembly for sequencing the pair of clamping arms to first capture said DUT and lock it in place, and then pressing the bed of contact pins together with said DUT; and a constraint channel associated with the clamping arms that moves at a user's urging to lock and unlock the clamping arms about said DUT.

11. The socket of claim 10, further comprising:

a set of springs for providing a contact force between the bed of contact pins and said DUT.

12. The socket of claim 10, further comprising:

a device bed with a matrix of pin holes that allow the bed of contact pins to penetrate and contact said DUT form beneath.

* * * * *